US009663346B1

(12) United States Patent
Bahr et al.

(10) Patent No.: US 9,663,346 B1
(45) Date of Patent: May 30, 2017

(54) MEMS-BASED RESONANT FINFET

(71) Applicant: GLOBALFOUNDRIES Inc., Grand Cayman (KY)

(72) Inventors: Bichoy Bahr, Cambridge, MA (US); Zoran Krivokapic, Santa Clara, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/046,245

(22) Filed: Feb. 17, 2016

(51) Int. Cl.
*H03B 1/00* (2006.01)
*H03K 3/00* (2006.01)
*B81B 3/00* (2006.01)
*H03H 3/007* (2006.01)
*H03H 9/24* (2006.01)
*H01L 29/78* (2006.01)

(52) U.S. Cl.
CPC .......... *B81B 3/0021* (2013.01); *H01L 29/785* (2013.01); *H03H 3/0072* (2013.01); *H03H 9/2405* (2013.01); *B81B 2201/0271* (2013.01); *H03H 2009/241* (2013.01)

(58) Field of Classification Search
USPC ..... 327/108–112, 379, 389, 391; 326/22–27, 326/81–87
See application file for complete search history.

(56) References Cited

U.S. PATENT DOCUMENTS

| 9,520,510 B2 * | 12/2016 | Xue | H01L 31/02327 |
| 2012/0001229 A1 * | 1/2012 | Zhu | B82Y 10/00 |
| | | | 257/192 |
| 2012/0223331 A1 * | 9/2012 | Zhu | H01L 29/66795 |
| | | | 257/77 |
| 2012/0299175 A1 * | 11/2012 | Tran | B82Y 10/00 |
| | | | 257/712 |
| 2015/0155400 A1 * | 6/2015 | Xue | G06F 3/0412 |
| | | | 257/53 |

* cited by examiner

*Primary Examiner* — Brandon S Cole
(74) *Attorney, Agent, or Firm* — Wayne F. Reinke; Heslin Rothenberg Farley & Mesiti P.C.

(57) ABSTRACT

A semiconductor structure includes a semiconductor substrate, fins coupled to the semiconductor substrate, FinFETs on the fins, a common gate for the FinFETs, a dielectric layer on the semiconductor substrate, the dielectric layer surrounding a cavity with the semiconductor substrate providing bottom confinement of the acoustic cavity by total internal reflection, and an interconnect structure above the FinFETs, the interconnect structure including phononic crystal(s) to confine acoustic energy in the cavity including the cavity and metal layer(s) sandwiched between two dielectric layers. The semiconductor structure may be realized, during FEOL fabrication of a FinFET, by forming a cavity on a surface of a semiconductor substrate. Then, after fabrication of the FinFET, forming an interconnect structure for the FinFET. During formation of the interconnect structure, materials of the interconnect structure are used to form a phononic crystal to confine the cavity between the phononic crystal and the semiconductor substrate.

20 Claims, 8 Drawing Sheets

US 9,663,346 B1

MEMS-BASED RESONANT FINFET

BACKGROUND OF THE INVENTION

Technical Field

The present invention generally relates to resonant three-dimensional transistors. More particularly, the present invention relates to MEMS-based resonant FinFETs.

Background Information

High-Q filters can be used to create oscillators by incorporating them in a positive feedback loop with amplifiers providing adequate gain. The "Q" refers to "quality" factor—dimensionless parameter describing how underdamped an oscillator is, characterizes a resonator's bandwidth relative to its center frequency; higher Q equals lower rate of energy loss relative to the stored energy of the resonator (lower damping); higher Q means lower damping (lower energy loss).

Such oscillators are used as a signal source for communication systems as well as analog electronics. They can also be used as a clock source for digital electronics.

High-Q filters are also used in communication systems to select specific bands and channels, eliminate interferers, suppress spurious transmissions among many other usage. The higher the quality factor Q of the filter, the better selectivity it provides for different channels and bands, as well as lower phase noise and jitter for the oscillators constructed by such filters.

Existing solutions include those that can achieve 10's of GHz frequencies, however, these suffer from low quality factor (Q<50). Other existing solutions are very challenging to scale up to GHz frequencies. Still other existing solutions require extra fabrication steps, which may affect yield, and/or result in a limited thermal budget.

Thus, a need continues to exist for high-Q filters that do not suffer the above-noted shortcomings.

SUMMARY OF THE INVENTION

The shortcomings of the prior art are overcome and additional advantages are provided through the provision, in one aspect, of a method of fabricating a MEMS-based Resonant FinFET (RFT). The method includes, during FEOL fabrication of a FinFET, forming an acoustic resonance cavity on a surface of a semiconductor substrate, and after fabrication of the FinFET, forming an interconnect structure for the FinFET. The method further includes, during formation of the interconnect structure, using materials of the interconnect structure to form a phononic crystal, and confining the acoustic resonance cavity between the phononic crystal and the semiconductor substrate, creating a resonant FinFET.

In accordance with another aspect, a semiconductor structure. The semiconductor structure includes a semiconductor substrate, a plurality of fins coupled to the semiconductor substrate, a plurality of FinFETs on the plurality of fins, a common gate for the plurality of FinFETs, a dielectric layer on the semiconductor substrate, the dielectric layer surrounding a cavity with the semiconductor substrate providing bottom confinement of the cavity by total internal reflection, and an interconnect structure above the plurality of FinFETs, the interconnect structure including at least one phononic crystal to confine acoustic energy in the cavity including the cavity and at least one metal layer sandwiched between two dielectric layers.

These, and other objects, features and advantages of this invention will become apparent from the following detailed description of the various aspects of the invention taken in conjunction with the accompanying drawings.

DETAILED DESCRIPTION OF THE INVENTION

Figure 1:
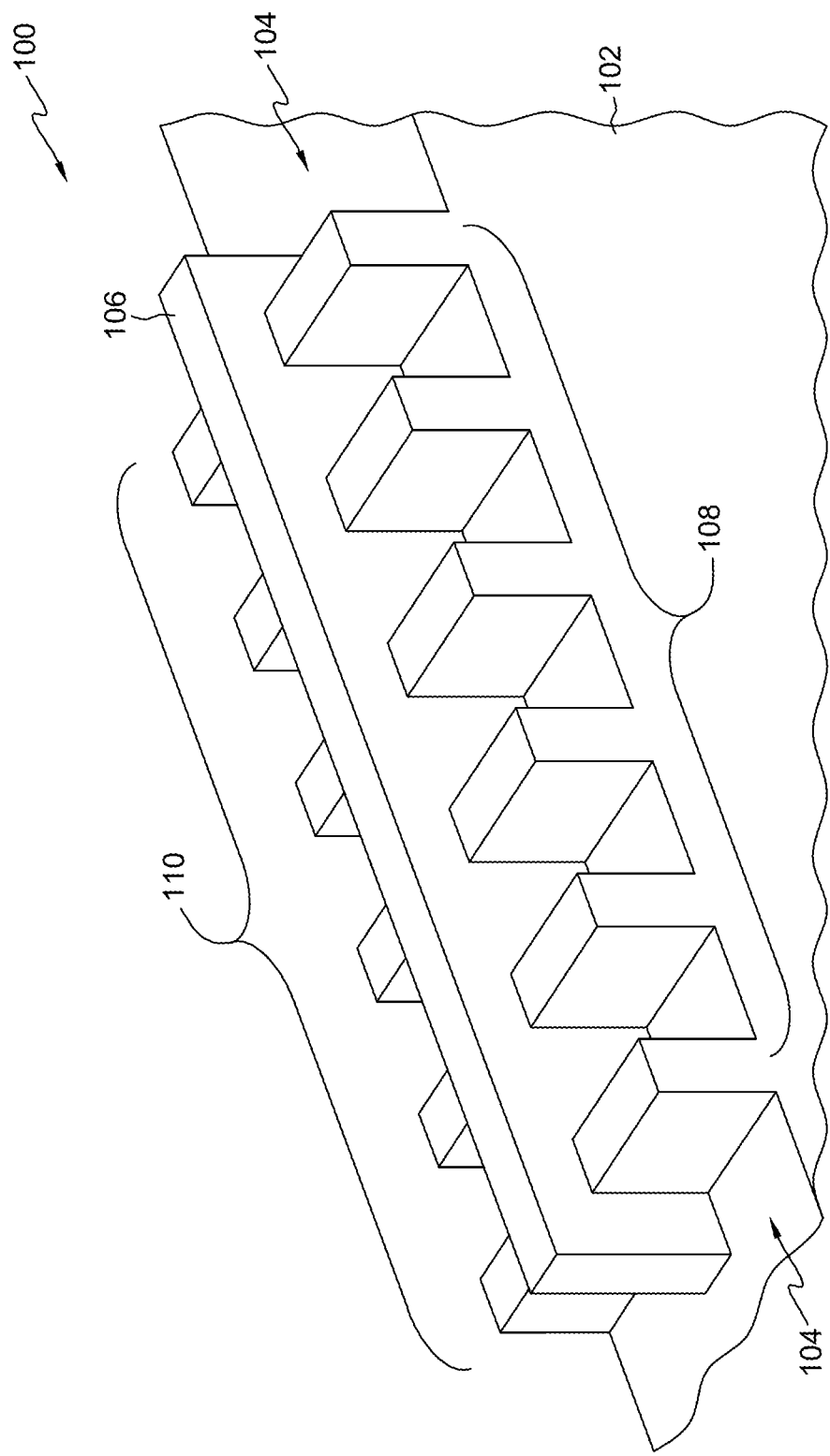
FIG. 1 is a three-dimensional elevational view of one example of a bottom portion of a MEMS-based resonant FinFET (RFT), the bottom portion including a bulk semiconductor substrate, multiple fins coupled to the semiconductor substrate, and a common gate surrounding center (channel) portions of the fins, each fin also including a source and a drain, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

CMOS resonant body transistors (RBTs) of the present invention are unreleased MEMS resonators implemented as an integral part of the CMOS Front End of the Line (FEOL) and Back End of Line (BEOL) process, without any extra release or passivation steps. They are fabricated just like any regular FET in commercial CMOS processes. With the lack of a release step and extra post-processing, CMOS RBTs do not compromise the yield of the CMOS process or the RBT itself. Also, as unreleased devices with no air gaps, they are inherently encapsulated in the CMOS die and do not require any special packaging or hermetic sealing.

CMOS RBTs of the present invention incorporate a mechanical resonance cavity located in the FEOL layers of the CMOS process. The RBT resonance cavity is defined from the top by 1D (dimension), 2D or 3D phononic crystal (PnC) formed from the metal and dielectric BEOL layers of the CMOS process. Total internal reflection from the CMOS bulk wafer is used to achieve energy confinement from the bottom, which together with the PnC define the cavity vertical dimensions.

Patterning of FEOL layers is used to construct in-plane reflectors achieving horizontal energy confinement and define the horizontal cavity dimensions. CMOS RBTs of the present invention make use of a regular FET from the CMOS technology for active FET sensing. The mechanical stresses in the acoustic resonance cavity modulate the mobility of the FET channel resulting in a small signal current in the external circuit when the FET is biased properly. CMOS RBTs are electrostatically driven by the help of MOS Capacitors (or regular FETs used as capacitors) available in CMOS BEOL.

Modulation of the charge on the MOS capacitor (through the gate voltage) causes a modulation of the electrostatic voltage induced by this charge, and inducing mechanical stress in the structure.

CMOS RBTs benefit from the small critical dimensions available for the FEOL of CMOS and are inherently scalable to GHz-frequencies. CMOS RBTs are also small in size spanning only a few micrometers, hence, they do not consume costly die area. With the CMOS RBTs available directly in the FEOL of the CMOS die, interconnects parasitic to CMOS circuits are minimal compared to any other integration scheme.

Phononic Crystals (PnC) in CMOS BEOL

Phononic crystals are 1D, 2D or 3D periodic structures characterized by bandgaps in their dispersion relations.

When elastic waves are incident on a PnC with a frequency that lies in the PnC bandgap, such waves can not propagate in the PnC due to the absence of an eigenmode vibrational mode of the structure that can support their propagation. As a result, such waves decay evanescently in the PnC, which results in strong reflection of the incident waves. PnCs act as high-reflectivity acoustic mirrors for frequencies in their bandgaps.

To construct PnCs, materials with high acoustic impedance (ratio of the wave stress to displacement velocity) contrast are used.

Materials available in the CMOS BEOL layers include, for example, copper metallization, tungsten, low-k dielectrics, silicon dioxides, copper capping layers, etch stop layers, anti-reflecting coatings, etc.

CMOS-RFT

The present invention includes, in one aspect, a method of fabricating a MEMS Resonant FinFET Transistor, or RFT in commercial CMOS FinFET technology.

The RFT includes a FinFET with an array of fins fabricated in a commercial FinFET technology flow on a bulk wafer. The wafer may include a buried oxide layer (silicon on insulator, or SOI wafer).

The RFT further includes a gate that can be, for example, a poly-silicon gate, a metal gate or replacement metal gate (RMG). The gate may also include multiple barrier and etch stop layers. The RFT includes a gate dielectric that can be a high-k dielectric, an oxide or any form of insulator.

The gate, gate dielectrics and fins constitute the RFT FEOL structure. The RFT FEOL structure has natural mechanical vibrational modes (eigenmodes) at specific and discrete natural resonance frequencies (eigenfrequencies) that can be excited and sensed given proper transduction. For some natural vibrational modes of the RFT FEOL structure, total internal reflection from the wafer bulk can be achieved, resulting in a vertical confinement of the mechanical vibrational energy therein. Vibrational RFT modes with poor energy confinement suffer from degraded quality factor. Specific vibrational modes can be selected by using proper spatial excitation or driving patterns.

BEOL metallization layers available in the CMOS FinFET process can be patterned to form 1D, 2D or 3D phononic crystals that can be used to confine the mechanical vibrations to the RFT FEOL structure.

CMOS-RFT Excitation

The RFT natural vibrational modes are to be excited with a source of mechanical stress incorporated in the mechanical structure itself. The voltage difference between the gate and source/drain creates a charge in the FinFET capacitance, which induces an electrostatic force. Such electrostatic force creates mechanical stress in the RFT structure. Modulation of the RFT gate to source/drain voltage, causes a modulation of the electric charge and hence the electrostatic force together with the mechanical stress generated hereby.

In the specific example subsequently described, all the fins of the RFT share the same gate. However, the present invention is not limited to this configuration, as this is mostly a limitation of the current FinFET technologies for densely packed fin arrays.

CMOS-RFT FET Sensing

Mechanical vibrations in the RFT FEOL structure are to be actively sensed by a FinFET. A number (less than all) of the RFT fins is dedicated for active FinFET sensing. These fins, while still sharing their gate with the excitation (driving) Fins, have their source and drain sections properly biased for regular FinFET operation (saturation, linear and subthreshold are all possible operating modes), with sufficient current flowing in the FinFET drain. The stresses in the RFT fins modulate the carrier mobility in the sensing FinFET channel. Such modulation produces an RF current that flows through the FinFET that can easily be extracted by an external circuit.

CMOS-RFT Top Confinement

Acoustic energy confinement in the RFT FEOL layers is used to achieve natural mechanical resonance modes with high quality factors and low losses. Acoustic energy should be properly confined from all directions surrounding the RFT FEOL cavity.

Acoustic energy confinement from the top of the RFT FEOL cavity is achieved through a phononic crystal (PnC) constructed from the BEOL metallization layers and dielectrics, for example, interlayer dielectrics (ILD). A 1D, 2D or 3D BEOL PnC is designed for the RFT FEOL cavity to have either a partial or full bandgap around the RFT natural resonance frequency of interest.

The metallization layers may include, for example, copper, aluminum, tungsten, titanium, etc. The BEOL dielectric layers may include, for example, copper capping layers (CCL), etch stop layers (ESL), diffusion barriers (DB), antireflection coating (ARC) and low-k dielectrics such as, for example, SiCOH, SiOCN, SiCN, SiOC, SiN.

MOS-RFT 1D PnC

The partial bandgaps of a 1D PnC scales up to much higher frequencies than that attainable with a 2D PnC. The 1D PnC is also comparatively less prone to process variation, since it is only affected by the thickness of the different layers involved, whereas the 2D PnC is also susceptible to variations in the in-plane dimensions in addition to the layer thicknesses.

CMOS-RFT Lateral Confinement

Lateral confinement in the CMOS RFT of the present invention can be achieved by, for example, abrupt termination of the periodic Fin array and gate structure. The abrupt discontinuity in the material properties causes large reflections at the interface, allowing for acoustic energy to be confined in the RFT FEOL cavity region.

Bottom Confinement by Total Internal Reflection

The bulk wafer is a continuous and homogeneous medium; it can be approximated as infinitely large when compared to typical wavelengths of the resonant RFT structure.

The eigenmodes of the bulk wafer are just plane waves, with linear dispersion relation as $\omega=c|k|$, where c is the wave velocity in the bulk wafer (for both longitudinal and shear waves) and $|k|$ is the magnitude of the total wave vector that is composed of $k_x$ and $k_y$. A certain $k_x$ component can be enforced by having an excitation with certain spatial periodicity. For this case it is convenient to write the dispersion relation of the plane waves in the bulk as $\omega > c\, k_x$ (where $k_y$ is allowed to assume arbitrary values for given $k_g$). Thus, for a given $k_x$ (imposed by excitation periodicity), waves with frequency $\omega > c\, k_x$ can freely propagate in the bulk wafer.

For a given $k_x$, waves with frequency $\omega < c\, k_x$ will decay evanescently in the bulk wafer, resulting in a total reflection from the latter. This phenomenon is similar to the total internal reflection in optics. As the fin array is periodic with period a, the dispersion relation of the full RFT vertical stack, will be periodic in $k_x$ with period $k_x=2\pi/a$.

For the structural periodicity of the RFT, the highest frequency to achieve total internal reflection from the bulk wafer happens at $k_x=\pi/a$ and is given by $\omega=c\ \pi/a$. Since the velocity of the shear waves is always slower than that of the longitudinal waves for the bulk wafer, the highest frequency is limited by the shear sound velocity. $k_x=\pi/a$ corresponds to having the stresses in neighboring periods of the structures (in this case, neighboring fins) to be 180° out-of-phase. Thus, natural vibrational modes with stresses corresponding to $k_x=\pi/a$ and frequency lower than $\omega=c_{Shear}\ \pi/a$, will be completely reflected from the bulk wafer.

If the frequencies of such modes also fall into the bandgap of the PnC structure above, they will get reflected from the PnC as well and hence become trapped in the FEOL layers between the BEOL PnC and the bulk wafer, achieving total vertical confinement.

Fully Differential Drive/Sense

As demonstrated above, natural vibrational modes with stresses in neighboring fins out-of-phase by 180 degrees are the most that can be completely reflected from the bulk (by total internal reflection) and also may lie into the partial bandgaps of the 1D PnC.

It is desirable to be able to actuate and sense such natural vibrational modes. Fully-differential drive and sense is necessary to effectively drive or sense such stress distribution. Fully-differential drive and sense is also prune to common mode noise and reduce RF signal injected into the bulk wafer.

Ideally, a fully-differential drive/sense scheme would require individually contacting neighboring fins in the RFT array to route the positive and negative terminals of the fully-differential signal; a setup that is prohibited by most FinFET technologies nowadays. However, contacting a group of fins together is possible.

Fully differential driving and sensing can also be achieved by contacting an odd number X of fins and connecting them together as one terminal (say positive) then skipping an even number Y of fins (leave floating, or ground), then contacting the same odd number X of fins and connecting them together as the opposite polarity terminal (say negative).

The above-mentioned contact scheme will be referred to as active-X-skip-Y configuration for drive and sense. The ideal case of alternating polarity fins is simply active-1-skip-0 configuration. This is the most efficient driving configuration that will generate the highest driving stress in the structure. The period of the drive or sense signal in this case becomes 2×(X+Y)×a, where a is the pitch of the fin. The ideal configuration will have a drive/sense period of 2a. The bigger the numbers X or Y, the less efficient the driving/sensing scheme becomes; efficiency here refers to the amount of the stress generated in the structure.

The efficiency of the driving scheme can be judge by performing a Fourier series expansion for the drive spatial distribution with period 2×(X+Y)×a (with $k_x$ as the Fourier frequency variable) and considering the amplitude of the harmonic at $k_x=\pi/a$.

The configuration active-3-skip-4 is considered as an example for this analysis. The driving structure has a spatial period of 2×7×a=14×a. Table A below lists the spatial $k_x$ harmonics (in units of $\pi/a$) and the corresponding amplitude of each harmonic. The $7^{th}$ harmonic of the driving structure corresponds exactly to $k_x=\eta/a$ and has a Fourier coefficient of only 0.18 as compared to the fundamental at 0.79. Thus, the amplitude of the generated stress is traded for the feasibility of the structure.

TABLE A

| Spatial Harmonic | kx (π/a) | Fourier Coefficient |
|---|---|---|
| 1 | 0.14286 | 0.79385 |
| 2 | 0.28571 | 0 |
| 3 | 0.42857 | −0.38238 |
| 4 | 0.57143 | 0 |
| 5 | 0.71429 | −0.05666 |
| 6 | 0.85714 | 0 |
| 7 | 1 | 0.18189 |
| 8 | 1.1429 | 0 |
| 9 | 1.2857 | −0.03148 |
| 10 | 1.4286 | 0 |
| 11 | 1.5714 | −0.10429 |
| 12 | 1.7143 | 0 |
| 13 | 1.8571 | 0.061066 |
| 14 | 2 | 0 |
| 15 | 2.1429 | 0.052923 |

Resonance Frequency

The resonance frequency of the different RFT vibrational mode is set by the specific fin dimensions and pitch, the specific relation between frequency and dimensions highly depend on the fin geometry and the actual energy distribution in the vibrational mode.

Considering a fin width from 45 nm down to 7 nm with a pitch from 150 nm to 24 nm, obtaining natural vibrational modes for the corresponding RFT structures is possible from 10 GHz up to 100 GHz, respectively.

With the above in mind, FIG. 1 is a three-dimensional elevational view of one example of a bottom portion 100 of a MEMS-based resonant FinFET (RFT), the bottom portion including a bulk semiconductor substrate 102, multiple fins 104 coupled to the semiconductor substrate, and a common gate 106 surrounding center (channel) portions of the fins, each fin also including a source 108 and a drain 110, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The fins may be etched from a bulk substrate, and may include, for example, any of the materials listed above with respect to the substrate. Further, some or all of the fins may include added impurities (e.g., by doping), making them n-type or p-type.

Figure 2:
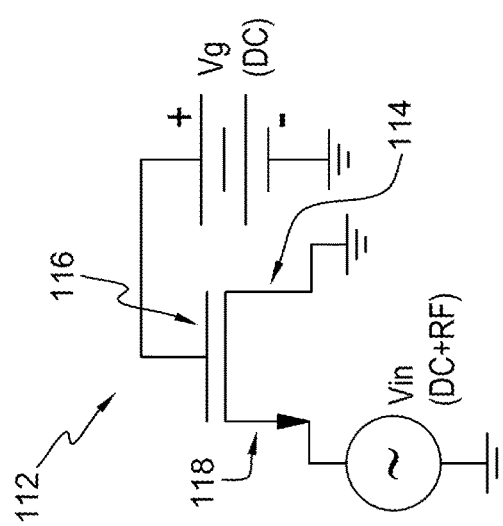
FIG. 2 is a circuit diagram showing one example of the bottom portion in FIG. 1 of an RFT from the perspective of a source, which is grounded, a gate with a DC bias acting as a radio frequency (RF) ground, and a drain with both an applied DC voltage and RF signal, in accordance with one or more aspects of the present invention.

FIG. 2 is a circuit diagram 112 showing one example of the bottom portion 100 in FIG. 1 of an RFT from the perspective of a source 114, which is grounded, a gate 116 with a DC bias acting as a radio frequency (RF) ground, and a drain 118 with both an applied DC voltage and RF signal, in accordance with one or more aspects of the present invention.

Figure 3:
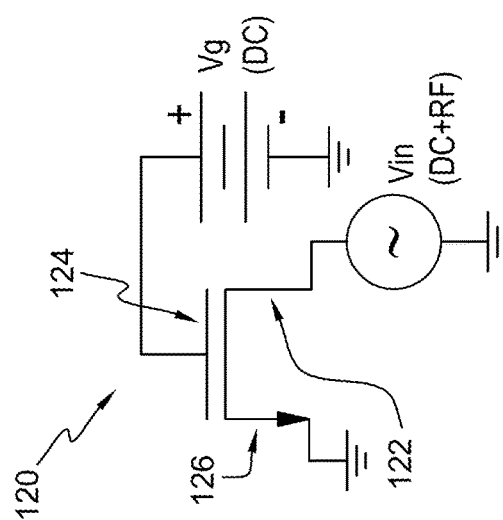
FIG. 3 is a circuit diagram showing one example of the bottom portion in FIG. 1 of an RFT from the perspective of a drain, which is grounded, a gate with a DC bias acting as a radio frequency (RF) ground, and a source with both an applied DC voltage and RF signal, in accordance with one or more aspects of the present invention.

FIG. 3 is a circuit diagram 120 showing one example of the bottom portion 100 in FIG. 1 of an RFT from the perspective of a drain 122, which is grounded, a gate 124 with a DC bias acting as a radio frequency (RF) ground, and a source 126 with both an applied DC voltage and RF signal, in accordance with one or more aspects of the present invention.

Figure 4:
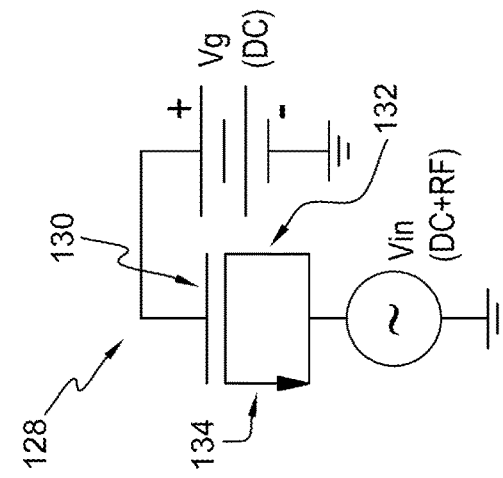
FIG. 4 is a circuit diagram showing one example of the bottom portion in FIG. 1 of an RFT, including a gate with RF ground, and a source and drain both being supplied with a common DC voltage and RF signal, in accordance with one or more aspects of the present invention.

FIG. 4 is a circuit diagram 128 showing one example of the bottom portion 100 in FIG. 1 of an RFT, including a gate 130 with RF ground, and a source 132 and drain 134 both being supplied with a common DC voltage and RF signal, in accordance with one or more aspects of the present invention.

Figure 5:
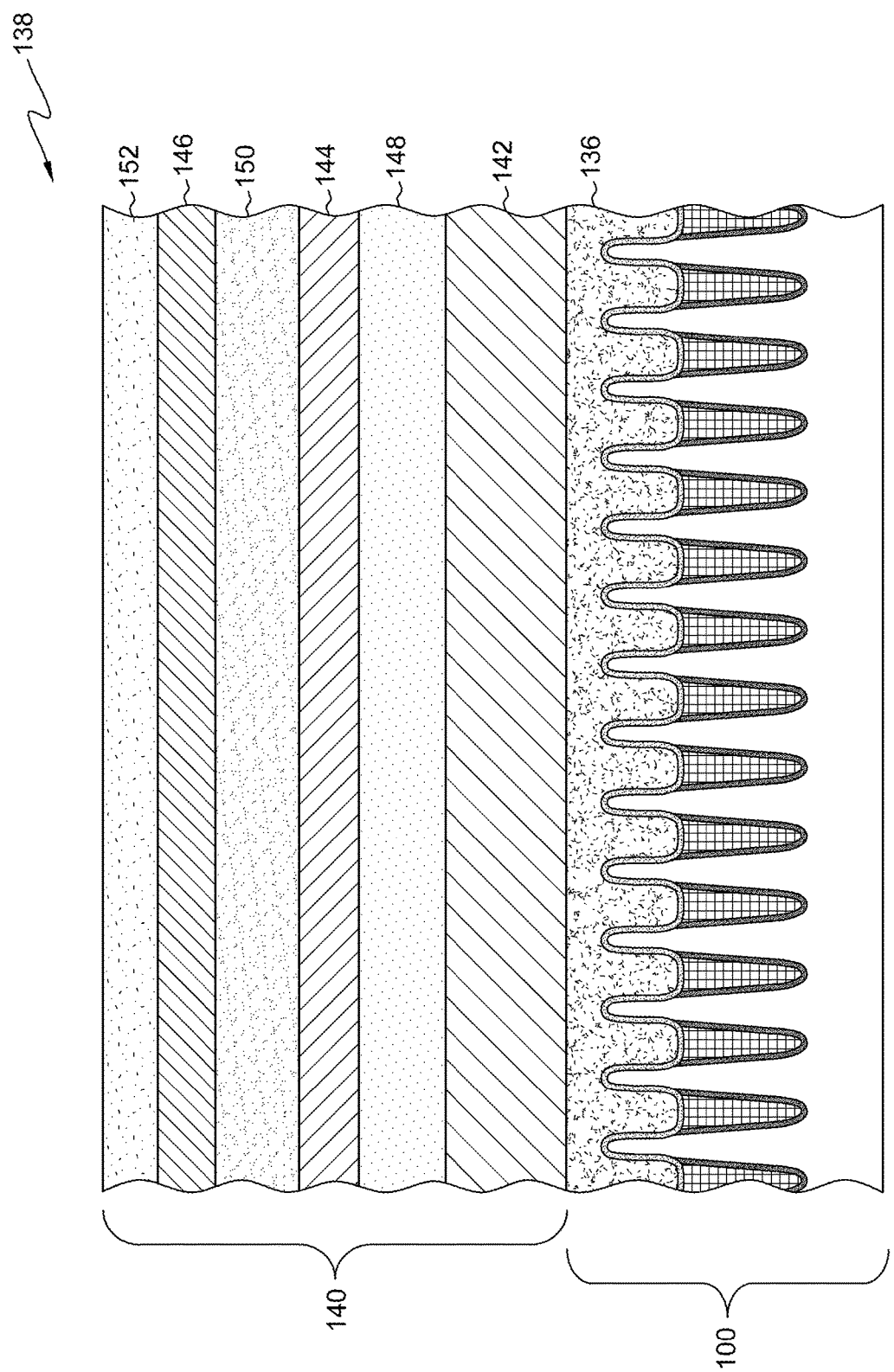
FIG. 5 is a cross-sectional view taken across a common gate of a partial RFT structure, the partial RFT structure including the bottom portion of FIG. 1 with an interconnect structure thereabove, the interconnect structure including three dielectric layers, one layer being thicker than the others and interspersed with three metallization layers, in accordance with one or more aspects of the present invention.

FIG. 5 is a cross-sectional view taken across a common gate 136 of a partial RFT structure 138, the partial RFT structure including the bottom portion 100 of FIG. 1 with an interconnect structure 140 thereabove, the interconnect structure including three dielectric layers (142, 144 and 146), layer 142 being thicker than the others and interspersed with three metallization layers (148, 150 and 152), in accordance with one or more aspects of the present invention.

Figure 6:
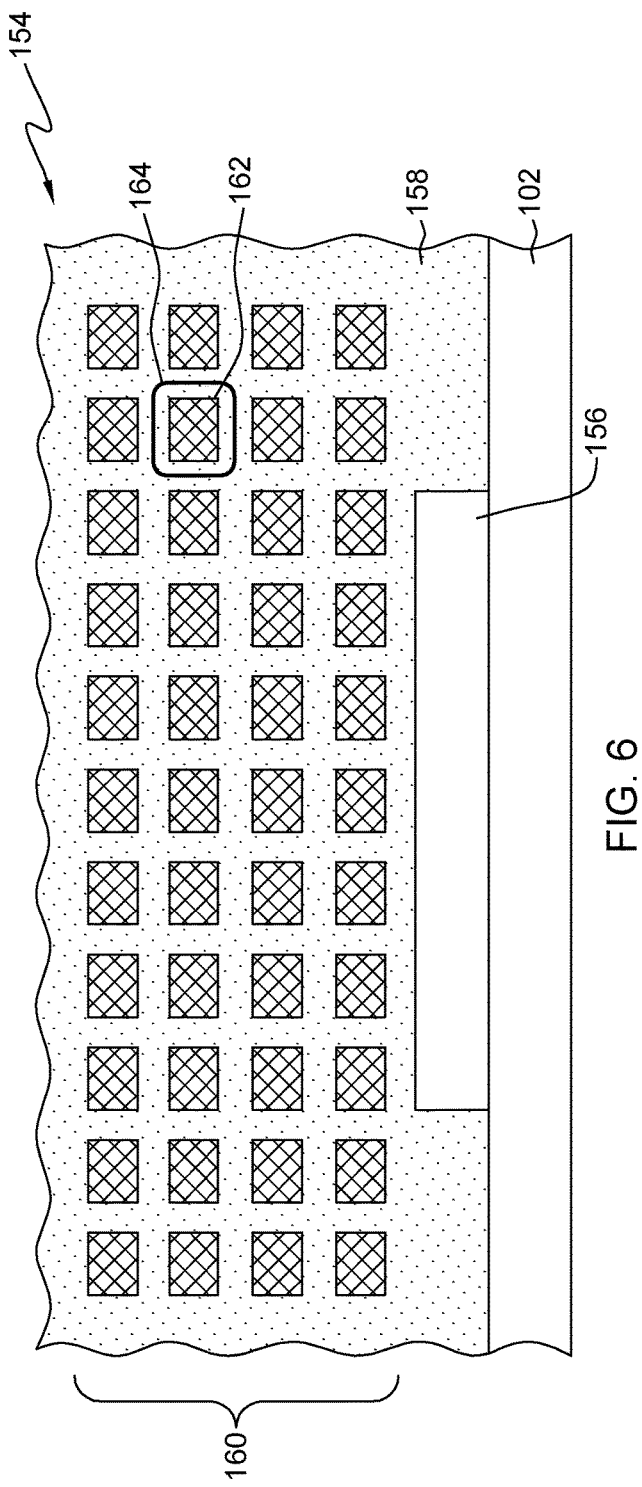
FIG. 6 is a cross-sectional view of one example of a phononic crystal (PnC) of a RFT, the partial RFT structure of FIG. 5 being the other part of a RFT, the PnC including bulk semiconductor substrate of FIG. 5, a cavity encased in dielectric material, and multiple metallization layers, the metallization layers each including metal lines, each metal line being a unit cell of the PnC, in accordance with one or more aspects of the present invention.

FIG. 6 is a cross-sectional view of one example of a phononic crystal (PnC) 154 of a RFT, the partial RFT structure 138 of FIG. 5 being the other part of a RFT, the PnC including bulk semiconductor substrate 102 of FIG. 5, a cavity 156 encased in dielectric material 158, and multiple metallization layers 160, the metallization layers each including metal lines (e.g., metal line 162), each metal line being a unit cell 164 of the PnC, in accordance with one or more aspects of the present invention.

Figure 7:
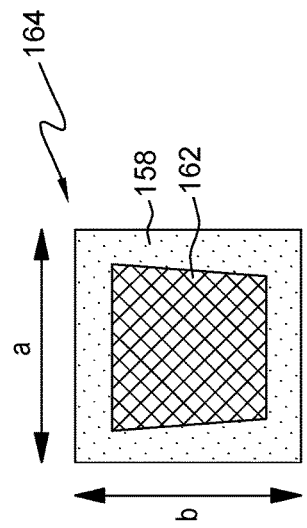
FIG. 7 depicts one example of the unit cell of FIG. 6, a metal line surrounded on all sides by dielectric, in accordance with one or more aspects of the present invention.

FIG. 7 depicts one example of the unit cell 164 of FIG. 6, metal line 162 surrounded on all sides by dielectric 158, in accordance with one or more aspects of the present invention.

Figure 8:
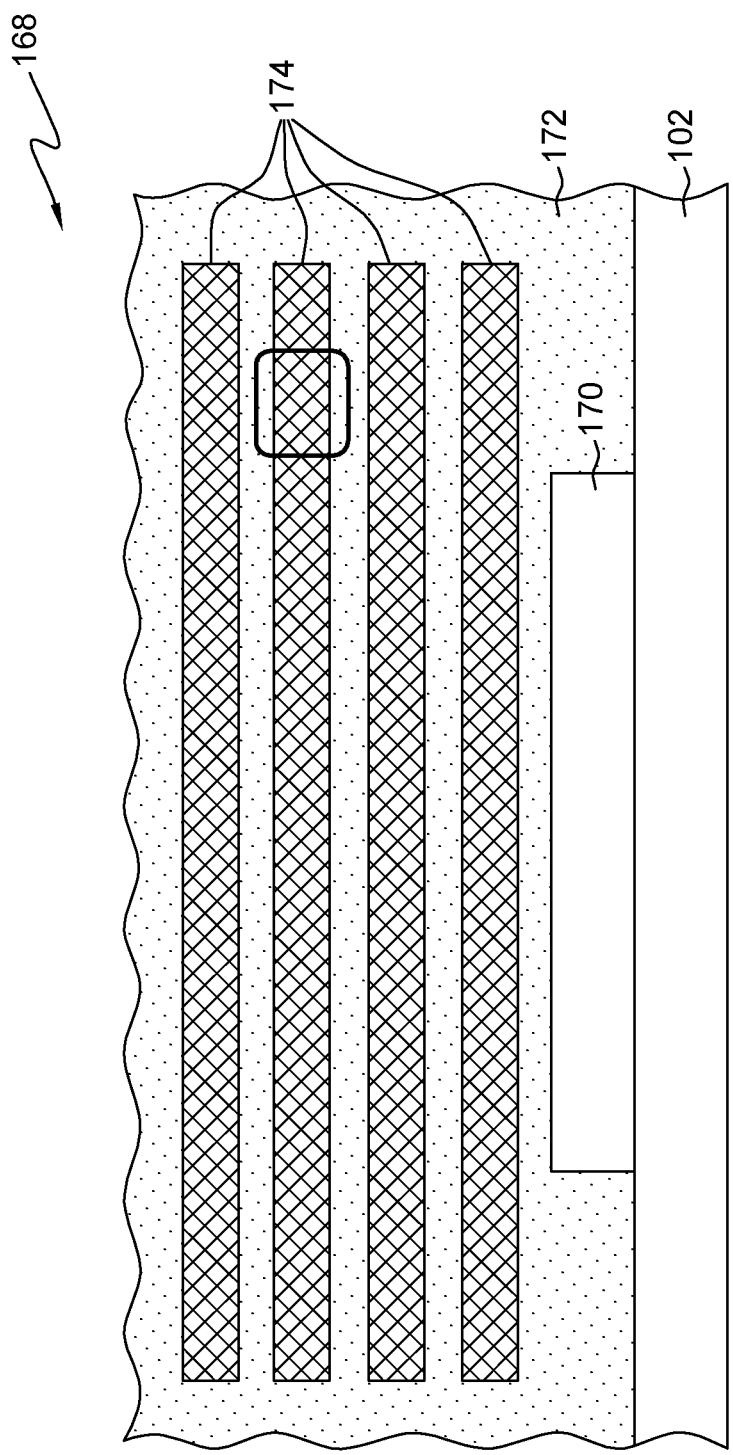
FIG. 8 is a cross-sectional view of one example of a PnC, the PnC including bulk semiconductor substrate of FIG. 5, a cavity encased in dielectric material interspersed with metallization layers, each metallization layer taking the form of a metal plate, in accordance with one or more aspects of the present invention.

FIG. 8 is a cross-sectional view of one example of a PnC 168, the PnC including bulk semiconductor substrate 102 of FIG. 5, a cavity 170 encased in dielectric material 172 interspersed with metallization layers 174, each metallization layer taking the form of a metal plate, in accordance with one or more aspects of the present invention.

Figure 9:
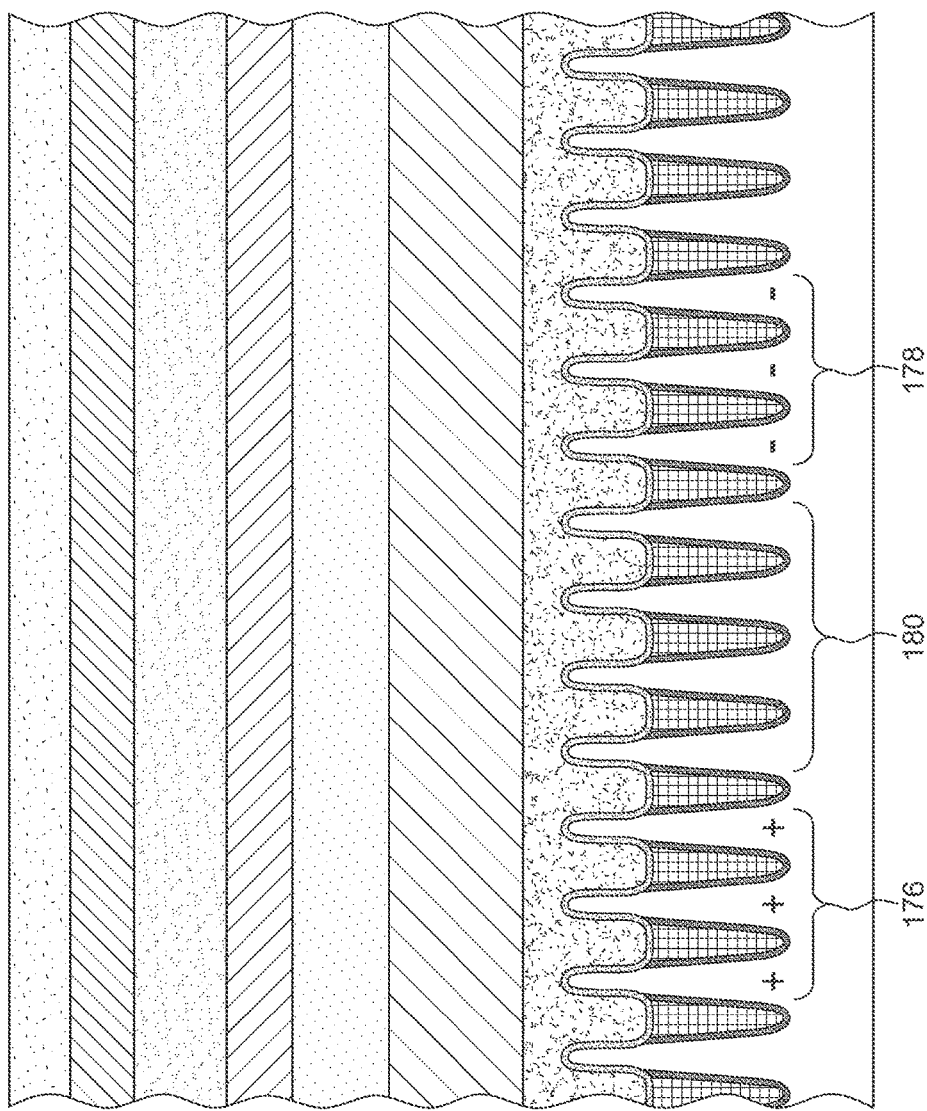
FIG. 9 depicts one example of the structure of FIG. 5 showing groups of fins of a RFT with fully differential drive/sense, the groups including groups having an uneven number of fins and opposite signal polarity, one group acting as the driver and another group acting as the sensor, separated by an inactive isolation group having an even number of fins, in accordance with one or more aspects of the present invention.

FIG. 9 depicts one example of the structure of FIG. 5 showing groups of fins of a RFT with fully differential drive/sense, the groups including group 176 and group 178 having an uneven number of fins and opposite signal polarity, group 176 acting as the driver and group 178 acting as the sensor, separated by inactive isolation group 180 having an even number of fins, in accordance with one or more aspects of the present invention.

Figure 10:
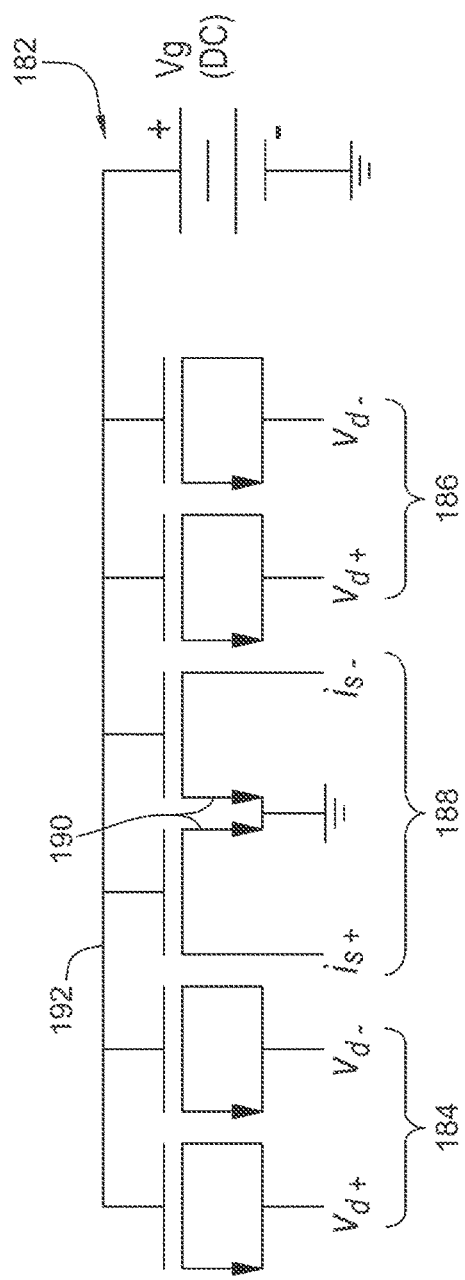
FIG. 10 is a circuit diagram of one example of a RFT, the RFT including opposite polarity driving FinFET pairs, and a sensing pair, the drains of the sensing pair electrically grounded, and the common gate with DC bias acting as a RF ground, in accordance with one or more aspects of the present invention.

FIG. 10 is a circuit diagram of one example of a RFT 182, the RFT including opposite polarity driving FinFET pairs 184 and 186, and sensing pair 188, the drains 190 of the sensing pair electrically grounded, and the common gate 192 with DC bias acting as a RF ground, in accordance with one or more aspects of the present invention.

Figure 11:
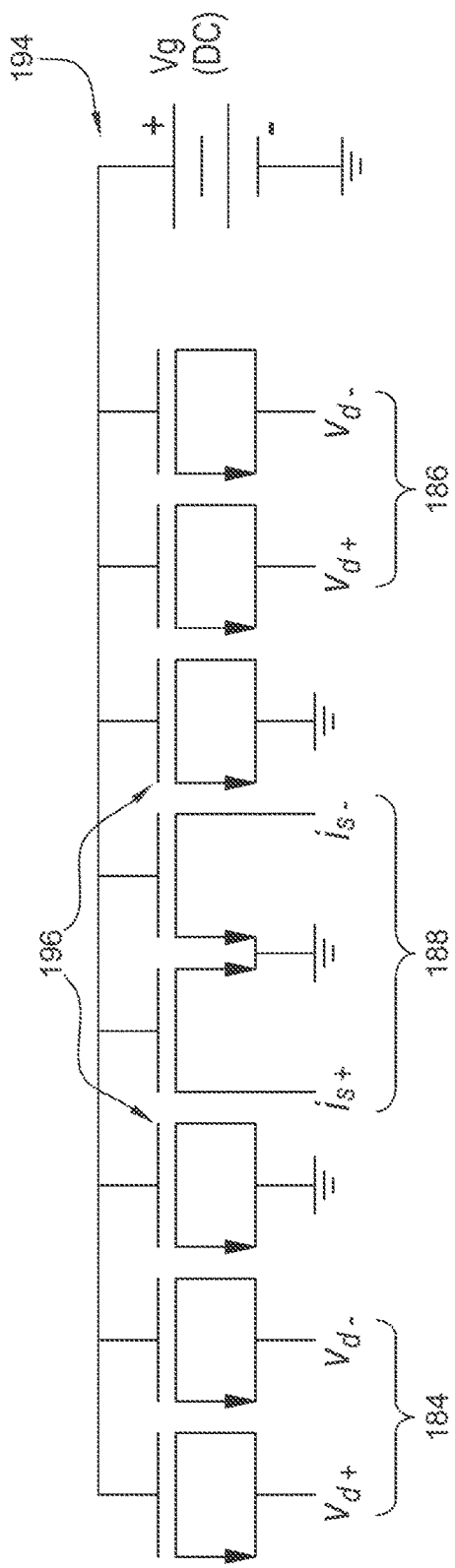
FIG. 11 is a circuit diagram of one example of a RFT similar to the RFT of FIG. 10, except that electrically grounded isolation FinFETs are placed between sensing a pair and driving pairs, in accordance with one or more aspects of the present invention.

FIG. 11 is a circuit diagram of one example of a RFT 194 similar to RFT 182 of FIG. 10, except that electrically grounded isolation FinFETs 196 are placed between sensing pair 188 and driving pairs 184 and 186, in accordance with one or more aspects of the present invention.

Figure 12:
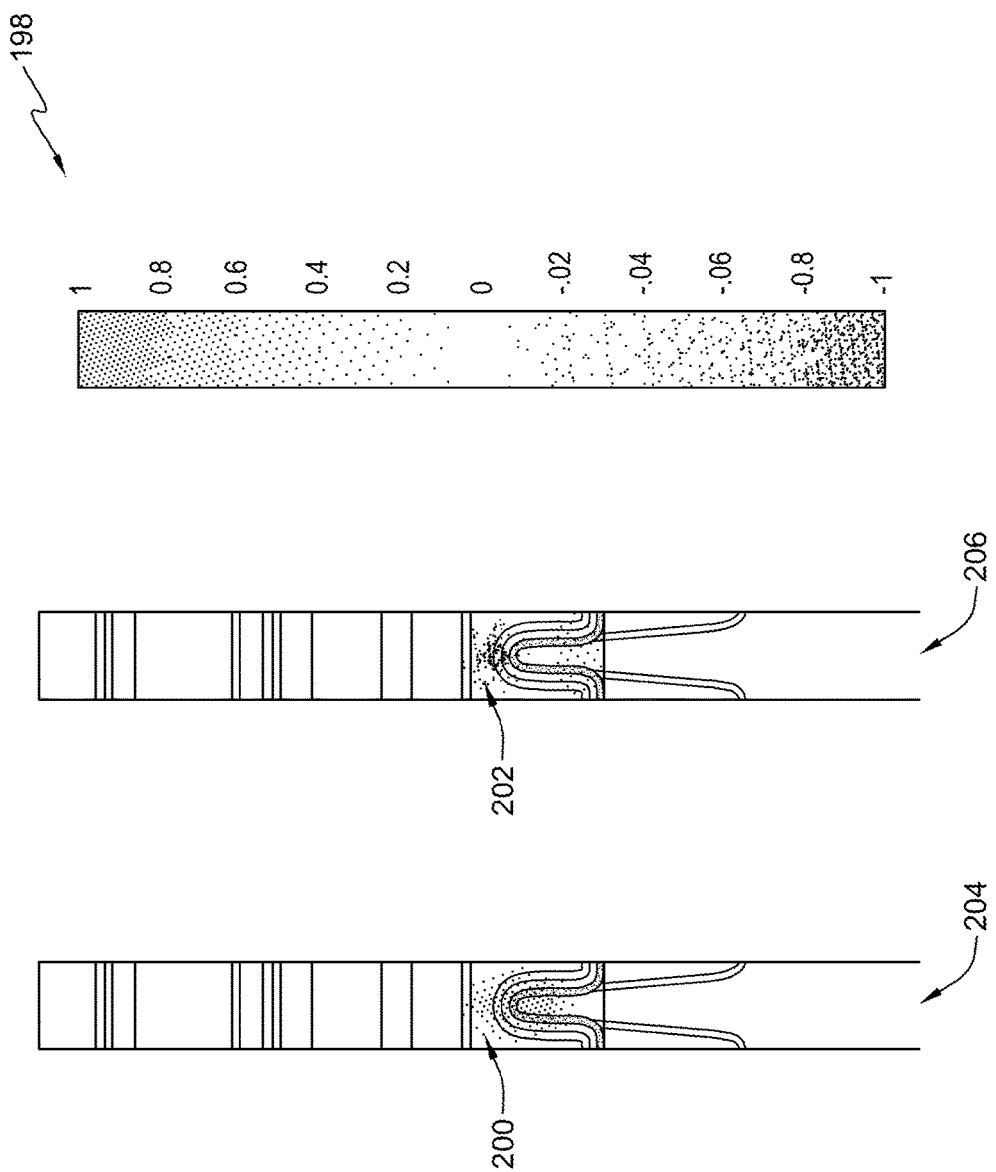
FIG. 12 is a cross-sectional view across a horizontal RFT period showing one example of different stresses and strains at various frequencies, a shading representing squeezing and a shading representing stretching of the gate area, only cases of one shade being physically possible, in accordance with one or more aspects of the present invention.

FIG. 12 is a cross-sectional view across a horizontal RFT period showing one example of different stresses and strains at various frequencies 198, shading 200 representing squeezing and shading 202 representing stretching of the gate area, only cases of one shade (cases 204 and 206) being physically possible, in accordance with one or more aspects of the present invention.

In a first aspect, disclosed above is a method. The method includes, during FEOL fabrication of a FinFET, forming an acoustic resonance cavity on a surface of a semiconductor substrate, and after fabrication of the FinFET, forming an interconnect structure for the FinFET. The method further includes, during formation of the interconnect structure, using materials of the interconnect structure to form a phononic crystal, and confining the acoustic resonance cavity between the phononic crystal and the semiconductor substrate, creating a resonant FinFET.

In one example, the method may further include, for example, operating the resonant FinFET, the operating including applying a voltage at the common gate such that the common gate is a radio frequency ground, applying voltages at each source and each drain such that the common gate operates in a predetermined manner, and applying a radio frequency signal at each source and/or each drain.

In one example, at least one fin may be, for example, a driving fin and at least one other fin may be, for example, a sensing fin, and the at least one other fin has a radio frequency current flowing therethrough. The method further includes, for example, confining acoustic energy in the acoustic resonance cavity.

In one example, confining acoustic energy of the cavity in the method of the first aspect, may include, for example, fabricating phononic crystal(s) in an interconnect structure above the common gate. In one example, the method may further include, for example, creating a bandgap around a natural resonance frequency of the cavity. In one example, creating the bandgap may include, for example, choosing a number of the phononic crystals.

In one example, the predetermined manner in the method of the first aspect may include, for example, one of accumulation, depletion and inversion.

In a second aspect, disclosed above is a semiconductor structure. The semiconductor structure includes a semiconductor substrate, fins coupled to the semiconductor substrate, FinFETs on the fins, a common gate for the FinFETs, a dielectric layer on the semiconductor substrate, the dielectric layer surrounding an acoustic resonance cavity with the semiconductor substrate providing bottom confinement of the cavity by total internal reflection, and an interconnect structure above the FinFETs, the interconnect structure including phononic crystal(s) to confine acoustic energy in the cavity including the cavity and metal layer(s) sandwiched between two dielectric layers.

In one example, at least one of the fins is a driving fin and at least one other fin is a sensing fin, and a radio frequency current flows through each sensing fin when in use.

In one example, a total number of phononic crystals of the semiconductor structure of the second aspect may, for example, determine a desired bandgap around a natural resonance frequency of the cavity when in use.

In one example, the semiconductor structure of the second aspect may further include, for example, a dielectric layer between the semiconductor substrate and the FinFETs.

In one example, the common gate of the semiconductor structure of the second aspect may include, for example, a dummy gate or a metal gate.

In one example, the common gate of the semiconductor structure of the second aspect may include, for example, barrier layer(s) and/or etch stop layer(s).

In one example, the metal layer(s) of the semiconductor structure of the second aspect may include, for example, metal lines separated by dielectric material.

In one example, the metal layer(s) of the semiconductor structure of the second aspect may include, for example, metal plate(s). In one example, the metal plate(s) may have, for example, a width about equal to a pitch of the fins.

In one example, the fins of the semiconductor structure of the second aspect may, for example, terminate abruptly.

In one example, the fins of the semiconductor structure of the second aspect may include, for example, group(s) of adjacent fins having a same terminal polarity. In one example, at least two groups of fins may include, for example, a first group of an odd number of active fins and a second group of an even number of inactive fins.

In one example, the fins of the semiconductor structure of the second aspect may include, for example, group(s) of driving fins with alternating terminal polarity and other group(s) of sensing fins with alternating terminal polarity.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
during FEOL fabrication of a FinFET, forming an acoustic resonance cavity on a surface of a semiconductor substrate;
after fabrication of the FinFET, forming an interconnect structure for the FinFET;
during formation of the interconnect structure, using materials of the interconnect structure to form a phononic crystal; and
confining the acoustic resonance cavity between the phononic crystal and the semiconductor substrate, creating a resonant FinFET.

2. The method of claim 1, further comprising operating the resonant FinFET, the operating comprising:
applying a voltage at the common gate such that the common gate is a radio frequency ground;
applying voltages at each source and each drain such that the common gate operates in a predetermined manner; and
applying a radio frequency signal at each source and/or each drain.

3. The method of claim 2, wherein at least one fin is a driving fin and at least one other fin is a sensing fin, and wherein the at least one other fin has a radio frequency current flowing therethrough; and
confining acoustic energy in the acoustic resonance cavity.

4. The method of claim 3, wherein confining acoustic energy of the cavity comprises fabricating one or more phononic crystals in an interconnect structure above the common gate.

5. The method of claim 4, further comprising creating a bandgap around a natural resonance frequency of the cavity.

6. The method of claim 5, wherein creating the bandgap comprises choosing a number of phononic crystals.

7. The method of claim 2, wherein the predetermined manner comprises one of accumulation, depletion and inversion.

8. A semiconductor structure, comprising:
a semiconductor substrate;
a plurality of fins coupled to the semiconductor substrate;
a plurality of FinFETs on the plurality of fins;
a common gate for the plurality of FinFETs;
a dielectric layer on the semiconductor substrate, the dielectric layer surrounding an acoustic resonance cavity with the semiconductor substrate providing bottom confinement of the cavity by total internal reflection; and
an interconnect structure above the plurality of FinFETs, the interconnect structure comprising at least one phononic crystal to confine acoustic energy in the cavity comprising the cavity and at least one metal layer sandwiched between two dielectric layers.

9. The semiconductor structure of claim 8, wherein at least one of the plurality of fins is a driving fin and at least one other fin is a sensing fin, and wherein a radio frequency current flows through each sensing fin when in use.

10. The semiconductor structure of claim 8, wherein a total number of phononic crystals determines a desired bandgap around a natural resonance frequency of the cavity when in use.

11. The semiconductor structure of claim 8, further comprising a dielectric layer between the semiconductor substrate and the plurality of FinFETs.

12. The semiconductor structure of claim 8, wherein the common gate comprises one of a dummy gate and a metal gate.

13. The semiconductor structure of claim 8, wherein the common gate comprises one or more barrier layers and/or one or more etch stop layers.

14. The semiconductor structure of claim 8, wherein the at least one metal layer comprises a plurality of metal lines separated by dielectric material.

15. The semiconductor structure of claim 8, wherein the at least one metal layer comprises at least one metal plate.

16. The semiconductor structure of claim 15, wherein the at least one metal plate has a width about equal to a pitch of the plurality of fins.

17. The semiconductor structure of claim 8, wherein the plurality of fins terminates abruptly.

18. The semiconductor structure of claim 8, wherein the plurality of fins comprises at least one group of adjacent fins having a same terminal polarity.

19. The semiconductor structure of claim 18, wherein the at least one group of fins comprises a first group of an odd number of active fins and a second group of an even number of inactive fins.

20. The semiconductor structure of claim 8, wherein the plurality of fins comprises at least one group of driving fins with alternating terminal polarity and at least one other group of sensing fins with alternating terminal polarity.

* * * * *